United States Patent [19]

Ashar et al.

[11] 3,911,558

[45] Oct. 14, 1975

[54] MICROAMPERE SPACE CHARGE LIMITED TRANSISTOR

[75] Inventors: Kanu Ashar, Wappingers Falls; Steven Magdo, Hopewell Junction, both of N.Y.

[73] Assignee: International Business Machines Corporation, Armonk, N.Y.

[22] Filed: July 22, 1974

[21] Appl. No.: 490,531

Related U.S. Application Data

[62] Division of Ser. No. 209,233, Dec. 17, 1971, Pat. No. 3,840,886.

[52] U.S. Cl. .................. 29/571; 29/577

[51] Int. Cl.[2] .................. B01J 17/00

[58] Field of Search .................. 29/571, 576 OC, 577; 357/42

[56] References Cited

UNITED STATES PATENTS

| | | | |
|---|---|---|---|
| 3,275,911 | 9/1966 | Onodera | 357/41 |
| 3,404,450 | 10/1968 | Karcher | 29/571 |
| 3,440,503 | 4/1969 | Gallagher | 357/42 |
| 3,701,198 | 10/1972 | Glinski | 29/577 |

*Primary Examiner*—W. Tupman
*Attorney, Agent, or Firm*—Robert J. Haase

[57] ABSTRACT

A space charge limited transistor formed on a high resistivity substrate of at least 10,000 ohm-centimeter silicon and of one conductivity type. One surface of the substrate is provided with an impurity zone of the other conductivity type. Spaced diffusions of said one conductivity type are made reaching through the impurity zone to the substrate. The distance separating the spaced diffused areas and the depths of the impurity and of the spaced diffused areas are determined so that a region of high resistivity substrate remains beneath the impurity zone between the spaced diffusions. The dielectric relaxation time within said region is much larger than the carrier transit time whereby space charge limited current flow is achieved upon the establishment of suitable bias conditions.

3 Claims, 6 Drawing Figures

MICROAMPERE SPACE CHARGE LIMITED TRANSISTOR

This is a division of application Ser. No. 209,233 filed Dec. 17, 1971, now U.S. Pat. No. 3,840,886.

BACKGROUND OF THE INVENTION

Integrated circuit development efforts are being directed towards achieving simpler processing techniques and circuits characterized by low power dissipation. With fewer processing steps, integrated circuit yields are likely to be higher with a concomitant decrease in production costs. Low power dissipation of devices and circuits makes feasible large scale integration. With low power circuits, more memory cells or logic circuits per chip are attained without complicated and costly cooling systems.

Low power transistor circuits are realized simply by lowering the operating current levels. Inasmuch as voltage levels for bipolar transistors are typically fixed at one to two volts, a reduction in power follows directly from a reduction in operating current. In the case of conventional bipolar transistors, however, gain drops to very low values as the operating currents reduce to microampere levels. It is also known that standby power dissipation can be reduced by using complementary transistor pairs. However, conventional complementary transistor pair technology requires the use of an excessive number of process steps and wasteful chip area allocation for the formation of pockets of one impurity type into a substrate of the other impurity type.

SUMMARY OF THE INVENTION

Space charge limited transistors exhibiting current gains up to the order of tens of thousands at microampere levels are realized by a relatively simple process comprising three photoresist steps and two diffusions. No epitaxy or other additional process steps are required to yield complementary transistor structures. The structure of the present invention comprises two lateral transistors formed in overlying relationship in a high resistivity substrate. The two transistors share the same emitter and collector but possess separate bases. The upper transistor is a lateral bipolar transistor while the lower transistor is a lateral space charge limited transistor. The base of the upper transistor is doped several orders of magnitude higher than the base of the lower transistor.

In operation, both transistors are cut off at zero base-emitter bias. As the base-emitter junction becomes increasingly forward biased space charge limited current is initiated first in the lower transistor. If the forward bias reaches a sufficiently high value, bipolar transistor action is also initiated in the upper transistor. Provision is made in some species of the present invention for inhibiting the bipolar transistor action in the upper transistor whereby space charge limited transistor action is maintained at higher forward bias values effectively prolonging the high current gain mode of operation attributable to the space charge limited transistor and delaying the onset of the lower current gain mode of the bipolar transistor of the composite double transistor structure.

Two types of space charge limited transistor structures are disclosed, one having immobile space charge in the base region at zero base bias and the other having mobile space charge in the base region under the same bias condition. Both types of transistor structure exhibit space charge limited conduction properties although the former type exhibits a somewhat more pronounced property with slightly higher current gain. Either type of transistor structure may be NPN or PNP.

DESCRIPTION OF THE PREFERRED EMBODIMENTS

Figures 1, 1A, 1B:
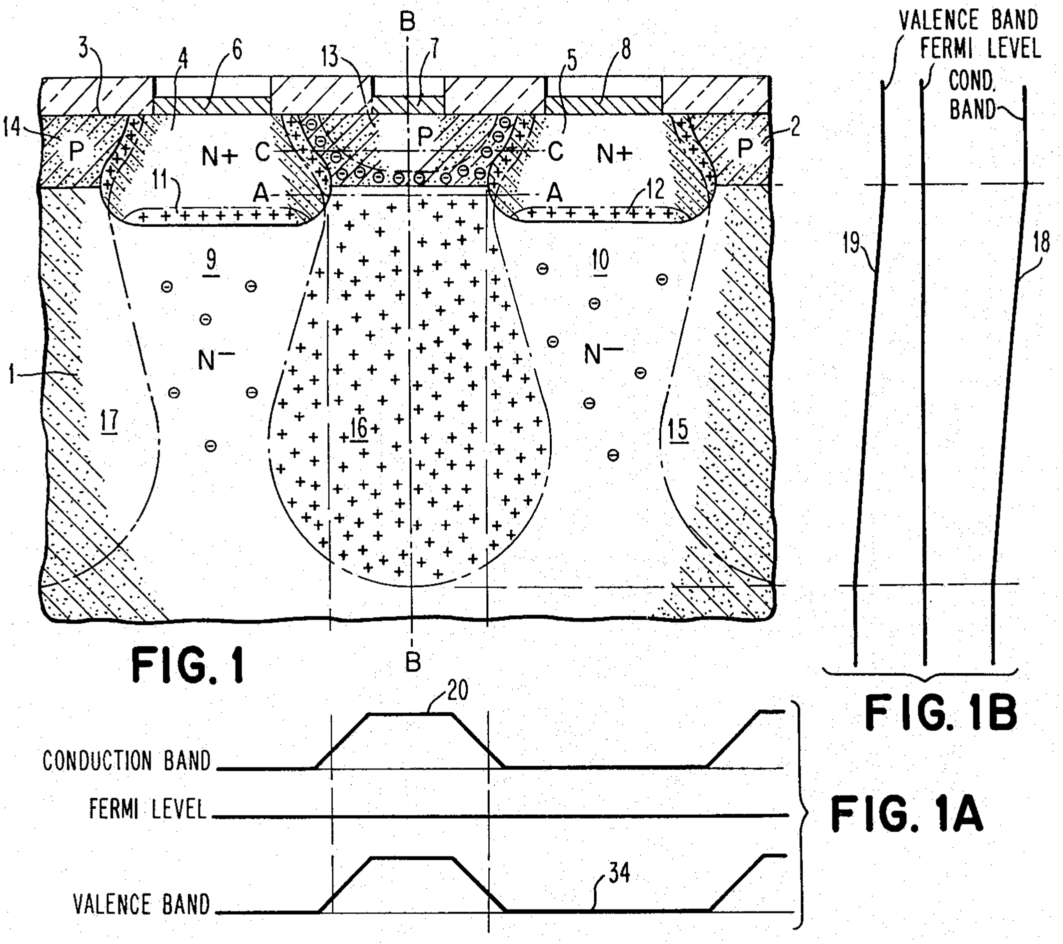
FIG. 1 is a cross-sectional view of a preferred NPN species of the present invention wherein immobile charges are formed in the base region of the space charge limited transistor with zero base bias.
FIG. 1A is an energy level diagram of the device of FIG. 1 along line A—A.
FIG. 1B is an energy level diagram of the device of FIG. 1 along line B—B.

Referring to FIG. 1, a high resistivity silicon substrate 1, having a resisitivity at least of the order of 10,000 ohm-centimeter (preferably 30,000 ohm-centimeter), is subjected to a blanket P diffusion through one surface to produce P diffused regions 2, 13 and 14. For example, the regions 2, 13 and 14 are produced by subjecting substrate 1 to a thermal oxidation at 970°C for 60 minutes, removing the oxide from the upper surface 3 of substrate 1 and carrying out a blanket boron capsule diffusion ($C_0 = 4 \times 10^{19}$ atoms/cc.) at 1050°C for 120 minutes.

After the boron capsule diffusion, substrate 1 is subjected to a thermal oxidation at 1100°C for 30 minutes and N+ emitter and collector diffusion windows are opened in the regrown oxide. Emitter and collector diffused areas 4 and 5 are diffused into substrate 1 through the oxide windows using, for example, an open tube phosphorus diffusion cycle with $POCl_3$ ($C_0 = 10^{21}$) at 970°C for 20 minutes. The emitter and collector diffusion is followed by an argon heat treatment at 1050°C for 12 minutes. Thus, the N+ diffused areas 4 and 5 penetrate into substrate 1 deeper than the P diffused area 2. Emitter base and collector contacts 6, 7 and 8, respectively, are formed in the usual manner. It will be noted that each of the described oxidation, diffusion and metallization steps, per se, is conventional in nature.

The N+ regions 4 and 5, in the absence of biasing potential applied to electrodes 6, 7 and 8, inject electrons into the N− substrate 1 and form negative mobile space charges in regions 9 and 10. Depletion regions 11 and 12 of immobile positive ions form on the N+ sides of the emitter and collector boundaries at the locations from which the mobile space charge electrons were injected.

The P regions 2, 13 and 14 deplete the N− substrate 1 to a depth of about 65 microns at zero bias conditions to form depletion regions 15, 16 and 17, respectively. Each of the depletion regions 15, 16 and 17 comprises positive immobile space charges. The regions are prevented from joining each other by the screening effect provided by the deeper N+ diffused regions 11 and 12. Correspondingly, the injected electrons in regions 9 and 10 are separated from each other by the positive immobile space charge region 16.

The potential distribution along vertical plane BB is shown in the energy level diagram of FIG. 1B. It can be seen that the presence of P region 13 raises both the conduction and valence bands 18 and 19, in the N− substrate 1 in the vicinity of the N+ regions 4 and 5 close to the values existing in the P level thereby separating the electrons injected into regions 9 and 10 from each other by an effective potential barrier. The potential barrier is shown in the energy level diagram of FIG. 1A representing the potential distribution along plane AA between the N+ regions 4 and 5. The potential step 20, formed by the high density immobile negative ions in region 13 prevents the mobile injected electrons of regions 9 and 10 from reaching each other. The amplitude of the potential step 20 decreases with distance from surface 3 along plane BB as shown in FIG. 1B. In short, the conduction and valence band energy levels of the P region 13 extend deep into the N− substrate 1 to separate the injected electrons presents in regions 9 and 10 with a firm potential step. The potential step 20 prevents the flow of collector current until the step is reduced by the application of a forward bias potential to base 13 relative to emitter 4 so that the depleted region 16 is contracted and electrons can be injected. The amplitude of step 20 also can be reduced by the application of a positive voltage to collector 5 relative to emitter 4 and base 13. However, the collector junction probably will break down before the relatively higher potential level is reached at the collector for injecting electrons into depleted region 16.

It can be seen that base 13 with its extended depletion region 16 controls electron flow between emitter 4 and collector 5 in an extremely effective manner similar to the action of the grid electrode in a vacuum tube triode. The electron flow control action is rendered even more effective because hole injection takes place from P region 13 into the depleted region 16 upon the application of positive bias on base 13 relative to emitter 4. The injected holes partly neutralize the negative space charge caused by the flow of electrons. The electron-hole recombination rate in the nearly intrinsic N− region is very small whereby very high gain is achieved especially at low current values.

The space charge limited current flow initiated in the structure of FIG. 1 along plane AA by the application of a forward base biasing potential depends upon the satisfaction of the condition that the dielectric relaxation time in the N− substrate 1 between emitter 4 and collector 5 is much larger than the carrier transit time. This condition, in turn, is met when:

1. the resistivity of substrate 1 is not lower than the order of about 10,000 ohm-centimeter (preferably 30,000 ohm-centimeter)
2. the spaced diffusions 4 and 5, which are of the same conductivity type as the substrate 1, penetrate deeper into the substrate than the blanket diffusion 2, 13 and 14 which is of opposite conductivity type,
3. the spaced diffusions 4 and 5 are separated by the high resistivity of the substrate below P diffusion 13.

The depths of both the blanket and spaced diffusions as well as the separation between the spaced diffusions must be determined accordingly.

As a forward bias applied to base 13 relative to emitter 4 is increased from zero, high gain space charge limited current flow is initiated between emitter 4 and collector 5 with the concomitant establishment of a negative space charge in the base region 16 of the space charge limited transistor. At the same time hole injection will start from the base 13 of the lateral transistor into the base 16 of the space-charge-limited transistor. The injected holes neutralize partly the negative space charge of the electron flow which results in an increase of collector current. The injected holes do not contribute to the collector current. Eventually, the base forward bias reaches a level sufficient to overcome the potential barrier existing along the plane CC in FIG. 1 to initiate conventional bipolar transistor current conduction at substantially reduced gain relative to the gain achieved during the space charge limited conduction mode.

It will be noted that the structure depicted in FIG. 1 is a combination of a conventional NPN lateral bipolar transistor (along plane CC) and a parallel connected N, N−, N space charge limited transistor (along section AA), the two transistors sharing a common emitter 4 and a common collector 5. The base of the upper bipolar transistor controls the base charge limited current flow in the lower transistor through the horizontal P N− junction between the two transistor bases. Provision is made in one of the species of the present invention to be described later for inhibiting the operation of the upper bipolar transistor in order to prolong the base charge limited mode of operation of the composite transistor structure at higher values of forward base potentials in order to realize the higher gains of the aforesaid mode.

Figure 2:
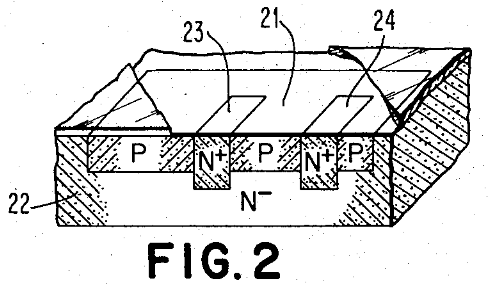
FIG. 2 is a fragmentary sectional view of the NPN species of FIG. 1.
Figure 3:
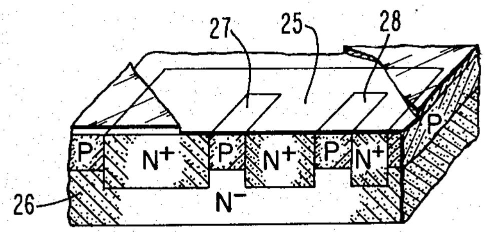
FIG. 3 is a fragmentary sectional view of a PNP species of the present invention.

The same diffusion cycles previoulsy described for producing the NPN structure of FIG. 1 also can be used to fabricate a PNP space charge limited composite transistor structure on the same chip. The PNP structure is a combination of a conventional bipolar PNP transistor overlying a parallel connected P N− P space charge limited transistor. The base of the bipolar transistor controls the space charge limited current flow in the lower space charge limited transistor through the horizontal N+ N− junction between the two transistor bases. This can be seen more clearly with the aid of FIGS. 2 and 3. The device structure in FIG. 2 is similar to that shown in FIG. 1. The structure of FIG. 3 differs in that the P areas are used as the emitter and collector and the intervening N+ area functions as the base. Depletion regions similar to region 16 of FIG. 1 form beneath the P areas in the devices of FIGS. 2 and 3. As previously explained, a space charge of immobile positive ions is present in each said depletion region. Space charges of mobile electrons form beneath the N+ areas in FIGS. 2 and 3 in the manner of areas 9 and 10 in FIG. 1. Whereas forward bias (positive) applied to the base 21 of FIG. 2 reduces the potential step 20 in FIG. 1A and also injects holes into the high resistivity substrate 22 permitting electron flow between emitter 23 and collector 24, the application of a forward bias (negative) to base 25 of FIG. 3 reduces the potential step 34 in FIG. 1A and injects more electrons into the high resistivity substrate 26 permitting hole flow between emitter 27 and collector 28. In FIG. 3, the injected electron neutralize partly the space charge in the hole flow thereby increasing the control action of the base on the collector current. The injected electrons do not contribute to the collector current. This space-charge-neutralizing effect is stronger in the device of FIG. 3 than in the device of FIG. 2 because the injected electron density from the base of the device of FIG. 3 is higher than the injected hole density from the base of the device of FIG. 2. Taking also into account that the hole mobility is lower than the electron mobility the current gain of the device of FIG. 3 is reduced by a factor of 2 or 3 with respect to the gain of the device in FIG. 2. However, the gains of both devices are orders of magnitude greater than the gains of conventional bipolar lateral transistors.

As described above, both the NPN and PNP space charge limited transistors are controlled by the base of a parallel lateral transistor in two ways. First, the base of the parallel transistor controls the potential step in the high resistivity base of the space-charge-limited transistor. Second, the base of the parallel transistor injects carriers into the high resistivity base of the space-charge-limited transistor. These carriers are of opposite type to those which carry the current flow and thus neutralize partly the space-charge in the current flow. This space charge neutralization effect gives the space-charge-limited transistor an exponential turn-on characteristic. In other words, the collector current will vary exponentially as a function of applied base voltage. This feature makes the space-charge-limited transistor very attractive for low voltage, fast switching application. In contrast, FETs have a slow, nearly quadratic turn-on characteristic.

It was mentioned earlier that the space charge limited conduction characteristic of the composite device of the present invention is attributable to transistor action taking place along plane AA of FIG. 1 whereas conventional lateral bipolar transistor action takes place along plane CC when the base forward biasing potential increases to a value sufficient to inject electrons over the relatively high potential barrier between N+ region 4 and P region 13. The onset of bipolar transistor action is inhibited in the device represented in FIG. 4 in order to achieve the relatively higher gains associated with space charge limited transistor action at higher forward base biasing potentials. As already pointed out, the net gain of the composite device falls substantially upon the initiation of bipolar transistor action.

Figure 4:
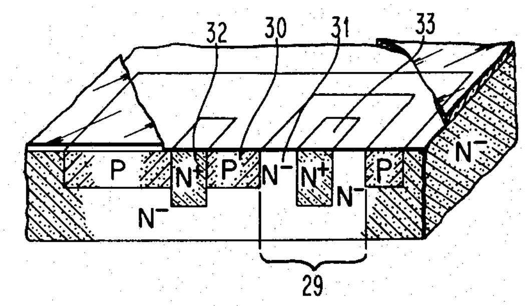
FIG. 4 is a fragmentary sectional view of a modification of the species of FIG. 2.

The device of FIG. 4 corresponds in structure to that of FIG. 2 with the exception that the P diffusion is masked in region 29 of FIG. 4 rather than being made in blanket fashion as in the case of FIG. 2. Thus, the base P region 30 is interrupted by N− region 31 between emitter 32 and collector 33 in the device in FIG. 4. The corresponding P region 21 in FIG. 2 extends without interruption completely between emitter 23 and collector 24. Experimental evidence has been obtained indicating that bipolar transistor action is substantially reduced in the embodiment of FIG. 4 enabling space charge limited current action to be extended to higher current levels of the order of 1 milliampere while also reducing collector-to-base capacitance and increasing the collector-to-base breakdown voltage.

It will be appreciated by those skilled in the art that each of the devices of the disclosed embodiments are fully operative upon the substitution of P− substrates for the indicated N− substrates, the substitution of N impurity zones for the indicated P impurity zones, and the substitution of spaced P+ diffusions for the indicated spaced N+ diffusions together with a reversal of the described operating potentials. Thus, for example, the PNP species of the present invention may be constructed as shown in FIG. 3 or, alternatively, by inverting both the impurity types and the operating potentials described in connection with FIG. 2. In the case where complementary NPN and PNP type devices are desired on the same chip, the construction shown in FIGS. 2 and 3 is employed because identically the same fabricating steps are involved. Of course, the NPN device of FIG. 2 is to be isolated from the PNP device of FIG. 3 where both are formed on the same chip. Effective isolation may be obtained simply by providing an additional N+ guard ring encircling the entire NPN transistor of FIG. 2. It should also be noted that the striped geometry employed in the devices of FIGS. 2, 3 and 4 can be replaced by enclosed type geometry (wherein the collector diffused area totally encloses its respective emitter diffused area) upon suitable modification of the mask patterns used in the diffusion operation.

While this invention has been particularly described with reference to the preferred embodiments thereof, it will be understood by those skilled in the art that the foregoing and other changes in form and details may be made therein without departing from the spirit and scope of the invention.

What is claimed is:

1. A method for simultaneously producing NPN and PNP space charge limited transistors comprising:

providing a high resistivity substrate of at least 10,000 ohm-centimeter semiconductor material and of one conductivity type, forming first impurity zones of the other conductivity type extending from one surface of said substrate into the interior thereof, forming second impurity zones of said one conductivity type extending from said one surface and reaching deeper into said substrate than said first impurity zones, a first pair of said first impurity zones being formed so that they are separated from each other by one of said second impurity zones and a second pair of said second impurity zones being formed so that they are separated from each other by one of said first impurity zones, providing contacts for biasing said first pair of zones and the second zone therebetween for transistor operation including forward biasing one of said first pair of zones relative to said second zone therebetween, and providing contacts for biasing said second pair of zones and the first zone therebetween for complementary transistory operation including forward biasing one of said second pair of zones relative to said first zone therebetween.

2. The method of claim 1 wherein said impurity zones are produced by diffusion.

3. The method of claim 1 wherein said first impurity zones are produced by blanket diffusion and said second impurity zones are produced by selective diffusion.

* * * * *